US011183365B2

(12) United States Patent
Abeshaus et al.

(10) Patent No.: US 11,183,365 B2
(45) Date of Patent: Nov. 23, 2021

(54) MULTIPLE ARC CHAMBER SOURCE

(71) Applicant: Axcelis Technologies, Inc., Beverly, MA (US)

(72) Inventors: Joshua Max Abeshaus, Salem, MA (US); Neil Bassom, Hamilton, MA (US); Camilla Lambert, Salisbury, MA (US); Caleb Wisch, Stow, MA (US); Kyle Hinds, Westfield, MA (US); Caleb Bell, Woburn, MA (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 0 days.

(21) Appl. No.: 16/850,066

(22) Filed: Apr. 16, 2020

(65) Prior Publication Data
US 2020/0335302 A1    Oct. 22, 2020

Related U.S. Application Data

(60) Provisional application No. 62/834,667, filed on Apr. 16, 2019.

(51) Int. Cl.
*H01J 37/317* (2006.01)
*H01J 37/08* (2006.01)
*H01J 37/32* (2006.01)

(52) U.S. Cl.
CPC .......... *H01J 37/3171* (2013.01); *H01J 37/08* (2013.01); *H01J 37/32899* (2013.01); *H01J 2237/20278* (2013.01); *H01J 2237/31705* (2013.01)

(58) Field of Classification Search
CPC .. H01J 37/08; H01J 37/3171; H01J 37/32899; H01J 2237/2028; H01J 2237/31705
See application file for complete search history.

(56) References Cited

U.S. PATENT DOCUMENTS

| | | | | |
|---|---|---|---|---|
| 5,300,785 | A * | 4/1994 | Aitken | H01J 37/08 250/423 R |
| 2005/0211923 | A1* | 9/2005 | Banks | H01J 27/08 250/492.21 |
| 2005/0226777 | A1* | 10/2005 | Bowers | G01N 1/14 422/501 |
| 2007/0080291 | A1* | 4/2007 | Buijsse | H01J 37/28 250/311 |

(Continued)

OTHER PUBLICATIONS

International Search Report and Written Opinion dated Jul. 2, 2020 in connection with International Patent Application No. PCT/US2020/028427.

*Primary Examiner* — David E Smith
(74) *Attorney, Agent, or Firm* — Echweiler & Potashnik, LLC

(57) ABSTRACT

An ion source for an ion implantation system has a plurality of arc chambers. The ion source forms an ion beam from a respective one of the plurality of arc chambers based on a position of the respective one of the plurality of arc chambers with respect to a beamline. The arc chambers are coupled to a carrousel that translates or rotates the respective one of the plurality of arc chambers to a beamline position associated with the beamline. One or more of the plurality of arc chambers can have at least one unique feature, or two or more of the plurality of arc chambers can be generally identical to one another.

19 Claims, 6 Drawing Sheets

(56) References Cited

U.S. PATENT DOCUMENTS

2011/0220812 A1* 9/2011 Chaney .................. H01J 37/08
250/426
2012/0129324 A1* 5/2012 Cherekdjian ..... H01J 37/32412
438/513

* cited by examiner

MULTIPLE ARC CHAMBER SOURCE

REFERENCE TO RELATED APPLICATIONS

This application claims the benefit of U.S. Provisional Application No. 62/834,667 filed Apr. 16, 2019, entitled "MULTIPLE ARC CHAMBER SOURCE", the contents of which are herein incorporated by reference in their entirety.

TECHNICAL FIELD

The present disclosure relates generally to ion implantation systems and methods for processing workpieces, and more specifically to an ion implantation system having multiple arc chamber sources.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

In general, a conventional ion source, and specifically an arc chamber (also called a plasma chamber) of the conventional ion source, comprises complex assemblies that typically have a relatively lower reliability compared to the entirety of an ion implanter. Generally speaking, no component is single-fault tolerant, and because of inconsistent modes of operation and various failure modes, it has been generally difficult to increase the uptime of conventional ion implantation systems. A preventive maintenance (PM) routine for components of conventional ion sources or a conventional arc chamber of a conventional ion source can bring down a conventional ion implanter for extended periods (e.g., several hours to days), not only to change or repair broken or worn component(s), but also to control particle contamination.

In addition, some conventional components are designed to operate over a wide range of species; however, the configuration or geometry of the conventional ion source or arc chamber may be compromised for one or more species to ensure compatibility with the remainder of the species to be implanted. For example, boron may preferably operate at a different temperature profile than carbon, but conventional ion sources have not had the ability to have specialized hardware (e.g., configuration or selection of hardware, geometry, etc.) for such different species.

In some cases, individual arc chambers have been designed for specific species, whereby one arc chamber that has been optimized for one species is removed from the conventional implanter and replaced with another arc chamber that has been optimized for another species. Typically, replacing conventional arc chambers has involved breaking and re-establishing a vacuum within a conventional ion implanter, wherein the vacuum pressure within the ion source is brought up and opened to atmospheric pressure, thus allowing the arc chambers are exchanged. Such a replacement of conventional arc chambers may be performed as a part of the preventive maintenance described above, or when a change in implant species is desired.

SUMMARY

The present disclosure provides various apparatuses, systems, and methods for a replacement or exchange of an arc chamber of an ion source in an ion implantation system while advantageously maintaining a vacuum associated with the ion source. In one exemplified aspect, an ion implantation system is provided having an ion source configured to form an ion beam, a beamline assembly configured to selectively transport the ion beam, and an end station is configured to accept the ion beam for implantation of the ions into a workpiece.

According to various aspects of the disclosure, a plurality of arc chambers attached to the source of the present disclosure can dramatically increase reliability of the ion source and allow for specialized hardware for different species. In one particular example, four identical arc chambers are positioned in a carrousel, whereby only one of the arc chambers is utilized at a time. If a component of the arc chamber being utilized fails, the carrousel is configured to rotate to the next of the plurality of arc chambers, thus potentially quadrupling the uptime in the case of four identical arc chambers. In an alternative example, four unique arc chambers are located in a carrousel, each with different configurations for the same or different species, thus enhancing the performance associated with a single species and/or preventing a failure mode unique to that species or various species.

Various examples provide electrical and gas connections that enable a single set of power supplies and gas systems to selectively feed all of the plurality of chambers. Costs can be thus minimized. Further, in another example, locating features are provided to ensure arc chamber exit apertures are correctly oriented with respect to the remainder of the beamline.

Thus, in accordance with various example aspects of the present disclosure, an ion source for forming an ion beam is provided, wherein the ion source comprises an extraction position generally defining a terminus of the ion beam. A plurality of arc chambers are provided. Each of the plurality of arc chambers, for example, is configured to ionize a dopant material. A translation apparatus is further provided and configured to selectively translate each of the plurality of arc chambers to the extraction position.

In one example, the translation apparatus comprises a carrousel, wherein the carrousel comprises a static cylinder that is rotationally fixed with respect to the extraction position. The carrousel further comprises a dynamic cylinder rotatably coupled to the static cylinder, wherein the plurality of arc chambers are operably coupled to the dynamic cylinder and circumferentially spaced thereabout. A rotational position of the dynamic cylinder with respect to the static cylinder, for example, selectively aligns each of the plurality of arc chambers with the extraction position.

The translation apparatus, in another example, further comprises an input shaft and a gear set. The gear set comprises a first gear operably coupled to the dynamic cylinder and a second gear operably coupled to the input shaft. The input shaft, for example, is configured to rotate the dynamic cylinder via the gear set, thereby providing the selective translation of each of the plurality of arc chambers to the extraction position. The translation apparatus can further comprise a motor operably coupled to the shaft, wherein the motor is configured to selectively rotate the shaft. Alternatively, the shaft can be manually rotated.

In another example, the translation apparatus further comprises one or more detents associated with one or more of the dynamic cylinder and the static cylinder. The one or more detents, for example, selectively lock the rotational position of the dynamic cylinder with respect to the static cylinder upon the selective alignment of each of the plurality of arc chambers with the extraction position.

A gas connection element, for example, can be associated with each of the plurality of arc chambers, respectively, wherein each gas connection element is configured to selectively interface with a fixed gas conduit associated with the static cylinder based on the rotational position of the dynamic cylinder. Further, one or more electrical connection elements can be associated with each of the plurality of arc chambers, respectively, wherein each of the one or more electrical connection elements are configured to selectively interface with one or more fixed electrical elements associated with the static cylinder based on the rotational position of the dynamic cylinder.

In one example, each gas connection element is configured to align with fixed gas conduit upon the selective alignment of each of the plurality of arc chambers with the extraction position, whereby the gas connection element and fixed gas conduit are separated by a gap of approximately 0.025 mm. In another example, the one or more electrical connection elements associated with each of the plurality of arc chambers comprise respective electrical connections to a cathode and a filament associated with the respective each of the plurality of arc chambers.

According to yet another example, two or more of the plurality of arc chambers can be generally identical to one another. In another example, all of the arc chambers of the ion source can be similar to one another. At least one of the plurality of arc chambers, for example, can have at least one unique feature with respect to a remainder of the plurality of arc chambers. In another example, at least one of the plurality of arc chambers is configured to form a plasma from a first source species, and at least another one of the plurality of arc chambers is configured to form a plasma from a second source species, wherein the first source species differs from the second source species. The first source species, for example, can comprise carbon, and the second source species can comprise boron.

In yet another exemplified aspect, an ion implantation system is provided, wherein the ion implantation system comprises an ion source configured to form an ion beam along a beamline. The ion source, for example, can comprise a plurality of arc chambers, wherein each of the plurality of arc chambers is selectively positionable along the beamline to respectively form the ion beam. The ion beam, for example, can thus have characteristics associated with the respective each of the plurality of arc chambers that is selectively positioned along the beamline.

The ion source, for example, is configured to selectively position each of the plurality of arc chambers along the beamline based on one or more implant conditions. The one or more implant conditions, for example, can comprise one or more of a desired species of an implant, a desired function of the implant, a predetermined length of time of operation of the ion source, a fault condition associated with the ion source, and a particle contamination condition.

In another example, the plurality of arc chambers of the ion implantation system are operably coupled to a carrousel, wherein the carrousel comprises a static cylinder that is rotationally fixed with respect to the beamline, and a dynamic cylinder rotatably coupled to the static cylinder. The plurality of arc chambers, for example, are operably coupled to the dynamic cylinder and circumferentially spaced thereabout, and wherein a rotational position of the dynamic cylinder with respect to the static cylinder selectively aligns each of the plurality of arc chambers with the beamline.

In a further example, an input shaft and a gear set are provided, wherein the gear set comprises a first gear operably coupled to the dynamic cylinder and a second gear operably coupled to the input shaft. The input shaft is thus configured to rotate the dynamic cylinder via the gear set, thereby selectively positioning of each of the plurality of arc chambers along the beamline. A motor, such as a servomotor, can be operably coupled to the shaft, wherein the motor is configured to selectively rotate the shaft.

Again, two or more of the plurality of arc chambers can be generally identical to one another, all of the plurality of arc chambers can be different from one another, or all of the plurality of arc chambers can have unique configurations. In yet another example, the plurality of arc chambers comprise four arc chambers in the form of a cross.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure.

These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
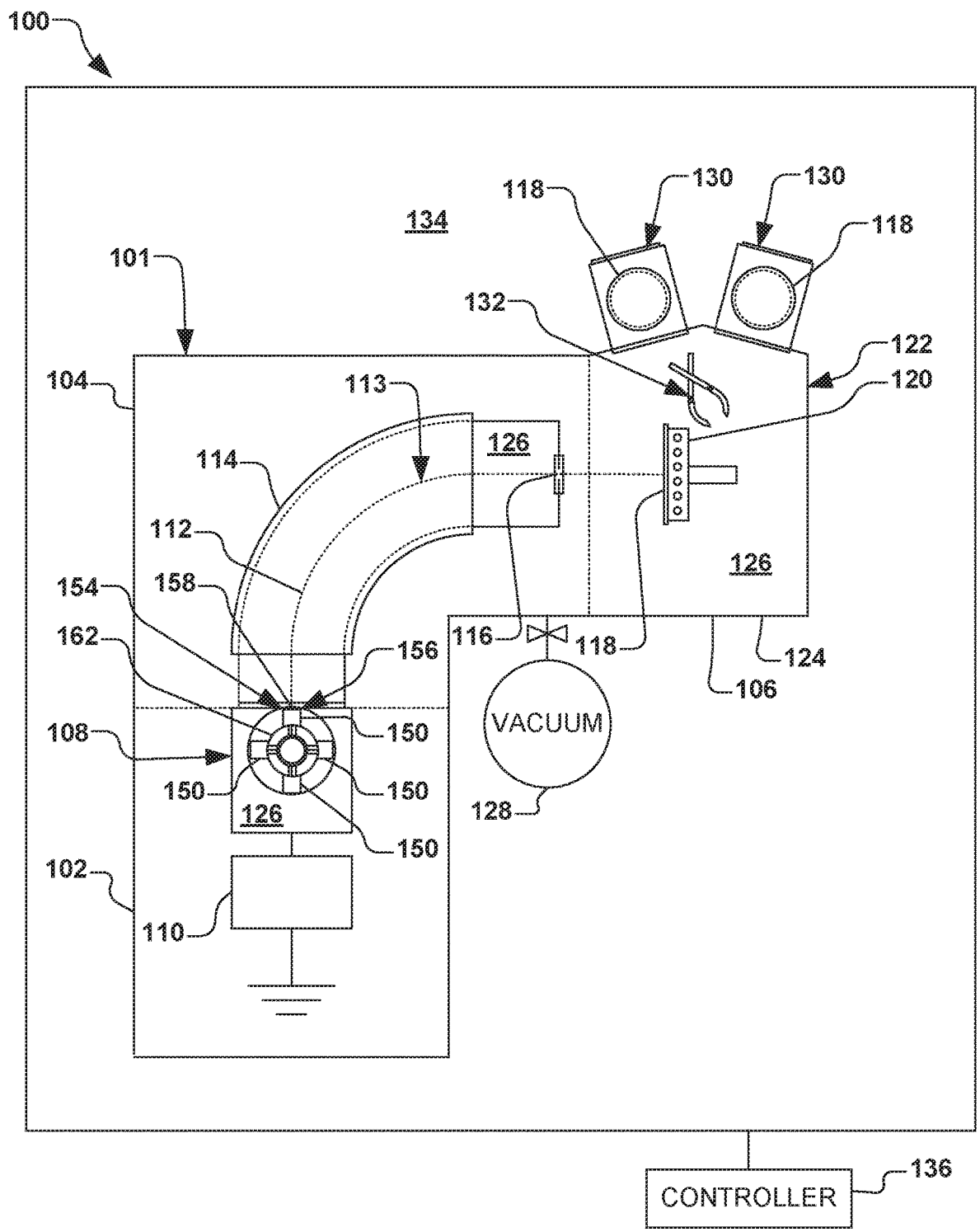
FIG. 1 is a block diagram of an exemplary vacuum system in accordance with several aspects of the present disclosure.

The present invention is directed generally toward ion implantation systems and arc or plasma chambers associated therewith. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details and features are set forth in order to provide a more thorough understanding of the present invention. It will be evident to one skilled in the art, however, that the present invention may be practiced without these specific details.

Various exemplified aspects and features of the disclosure facilitate ion implantation processes for implanting ions into a workpiece. According to one exemplified aspect, an ion implantation system is provided having an ion source configured to form an ion beam, a beamline assembly configured to selectively transport the ion beam, and an end station is configured to accept the ion beam for implantation of the ions into a workpiece.

As an overview of various aspects associated with the present disclosure, FIG. 1 illustrates an exemplified ion implantation system 100. The ion implantation system 100 in the present example comprises an exemplified ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed along a beamline 113 through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120. The chuck 120, for example, may comprise an electrostatic chuck (ESC) or mechanical clamp chuck, wherein the chuck may be configured to selectively control a temperature of the workpiece 118. Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplified aspect, the end station 106 comprises a process chamber 122, such as a vacuum chamber 124, wherein a vacuum environment 126 is generally maintained within the process chamber. A vacuum source 128 (e.g., one or more vacuum pumps), for example, can be configured to produce the vacuum environment 126 (e.g., a substantial vacuum) within one or more of the terminal 102, beamline assembly 104, and end station 106. For example, the vacuum source 128 can be fluidly coupled to one or more of the ion source 108, beamline assembly 104, and process chamber 122 to substantially evacuate the respective ion source, beamline assembly, and process chamber.

The workpiece 118, for example, may be selectively transferred to and from the process chamber 122 via one or more loadlock chambers 130 and a transfer apparatus 132, wherein the one or more loadlock chambers respectively isolate the vacuum environment 126 from an external environment 134 (e.g., an atmospheric environment). A controller 136, for example, is further provided to control one or more of the various apparatuses and systems associated with the terminal 102, beamline assembly 104, and end station 106 the ion implantation system 100.

The present disclosure thus provides various apparatuses, systems, and methods for a replacement or exchange of the arc chamber of the ion source with the advantage of not breaking the vacuum of the ion source. Referring again to FIG. 1, the present disclosure provides a plurality of arc chambers 150 that are operably coupled to, attached to, and/or disposed within the ion source 108 in order to dramatically increase the reliability of the ion source, as well as to allow for specialized hardware to be utilized for various implant species. The plurality of arc chambers 150, for example, are configured ionize one or more dopant materials for an extraction of one or more dopant species, therefrom, in the form of the ion beam 112.

In one example, each of the plurality of arc chambers 150 are configured substantially alike, whereby a single predetermined species of ion may be extracted from each of the plurality of arc chambers. In another example, one or more of the plurality of arc chambers 150 are configured differently from the remainder of the plurality of arc chambers. For example, a plurality of species and/or a plurality of conditions associated with a particular species can be extracted from each of the plurality of arc chambers. As such, the ion source 108, for example, is configured to extract and form the ion beam 112 from any one of the plurality of arc chambers 150 without having to open or otherwise expose vacuum environment 126 within the ion source 108 to the external environment 134.

Figure 2:
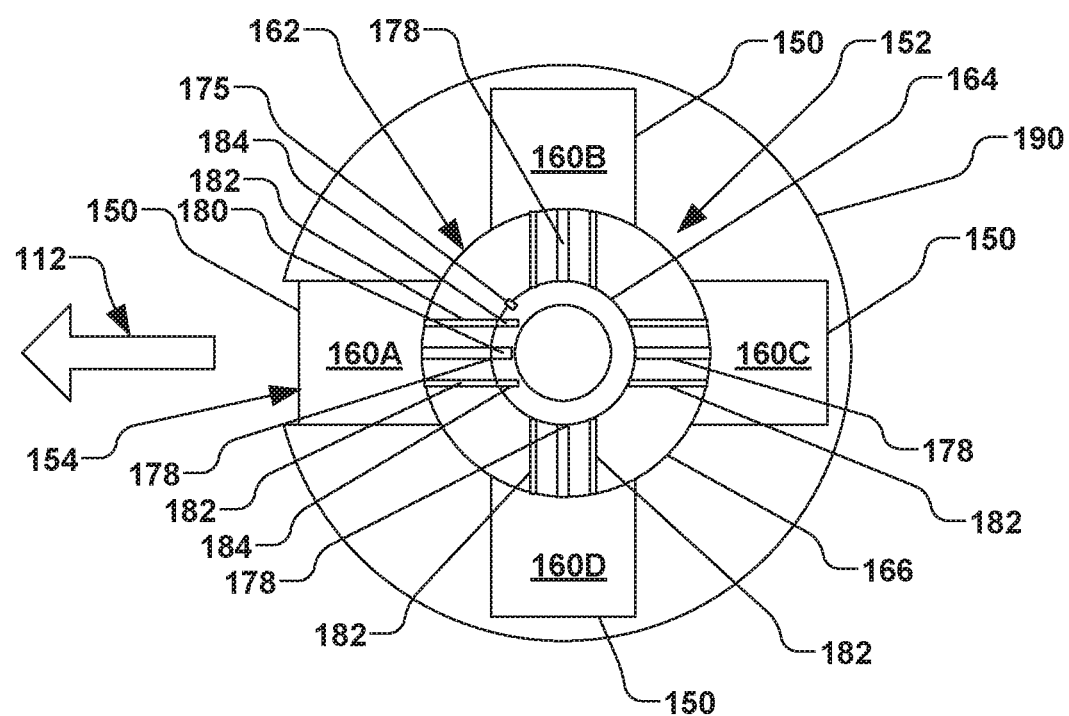
FIG. 2 is a schematic representation of an example ion source having a plurality of arc chambers according to various examples of the present disclosure.

The plurality of arc chambers 150 are provided on, coupled to, or otherwise associated with, a translation apparatus 152 configured to selectively translate each of the plurality of arc chambers to an extraction position 154. The extraction position 154, for example, generally defines a terminus 156 of the ion beam 112 of FIG. 1, where the ion beam emerges from an extraction aperture 158 associated with the ion source 108. For example, the plurality of arc chambers 150 are illustrated in FIG. 2 as four arc chambers 160A-160D generally in the form of a cross. While four arc chambers 160A-160D are shown in the shape of a cross, it is to be understood that any number of arc chambers and configuration thereof with respect to the translation apparatus 152 are contemplated as falling within the scope of the present disclosure.

In accordance with one example, the translation apparatus 152 is illustrated in FIG. 2 comprises a carrousel 162. The carrousel 162, for example, comprises a static cylinder 164 that is rotationally fixed with respect to the extraction position 154. A dynamic cylinder 166, for example, is further rotatably coupled to the static cylinder 164 to define the carrousel 162, wherein the plurality of arc chambers 150 are operably coupled to the dynamic cylinder and circumferentially spaced about the dynamic cylinder. As such, a rotational position of the dynamic cylinder 166 with respect to the static cylinder 164 selectively aligns each arc chamber 160A-160D with the extraction position 154.

The carrousel 162, for example, is configured to selectively position each of the plurality of arc chambers 150 such that only one arc chamber (e.g., arc chamber 160A in the example shown in FIG. 2) is positioned at the extraction position 154 at any given time. The ion beam 112 of FIG. 1, for example, is thus extracted from the selected one of the plurality of arc chambers 150 positioned at the extraction position 154.

Figure 3:
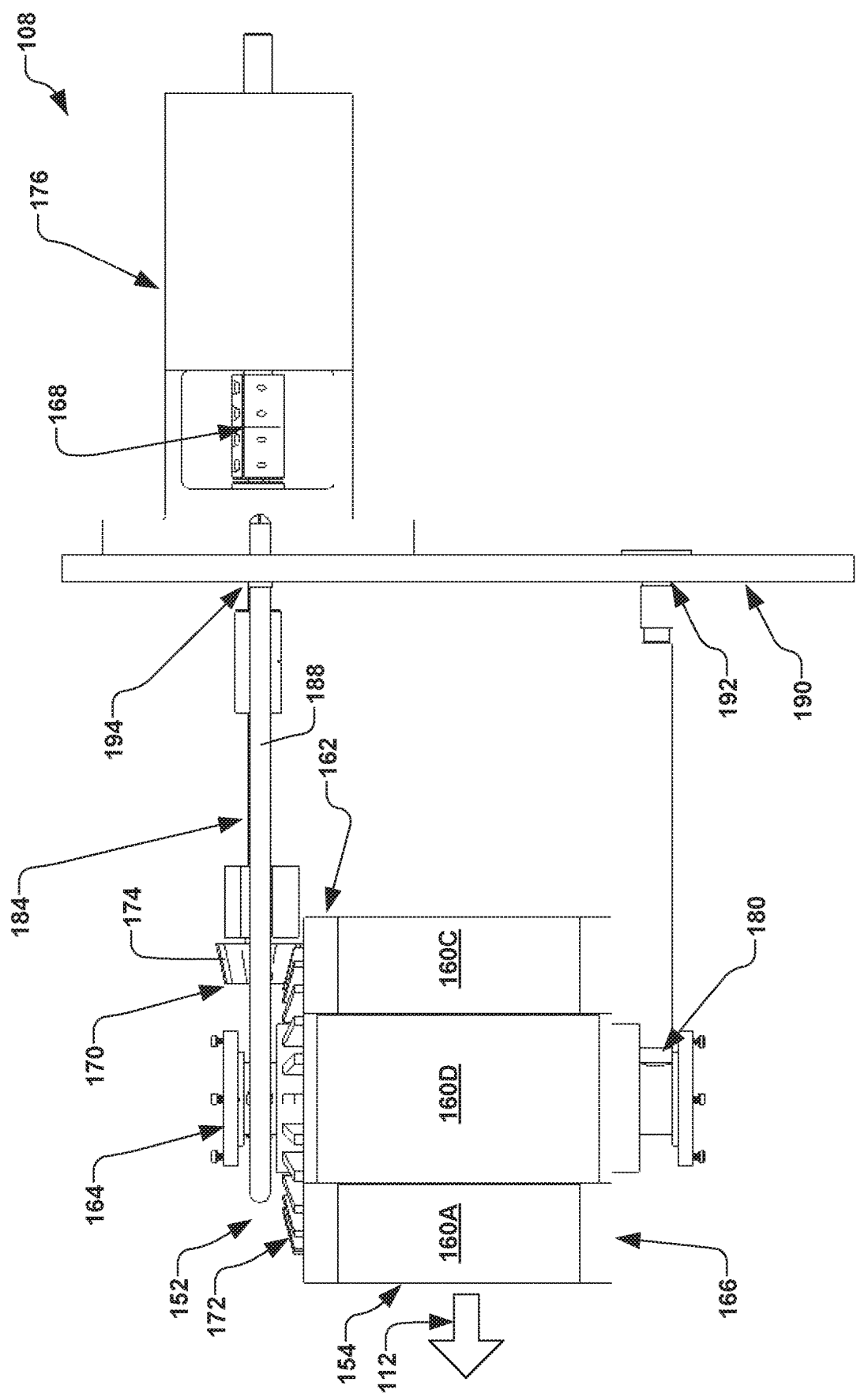
FIG. 3 is a side elevation view of an example ion source having a plurality of arc chambers according to various examples of the present disclosure.
Figure 4:
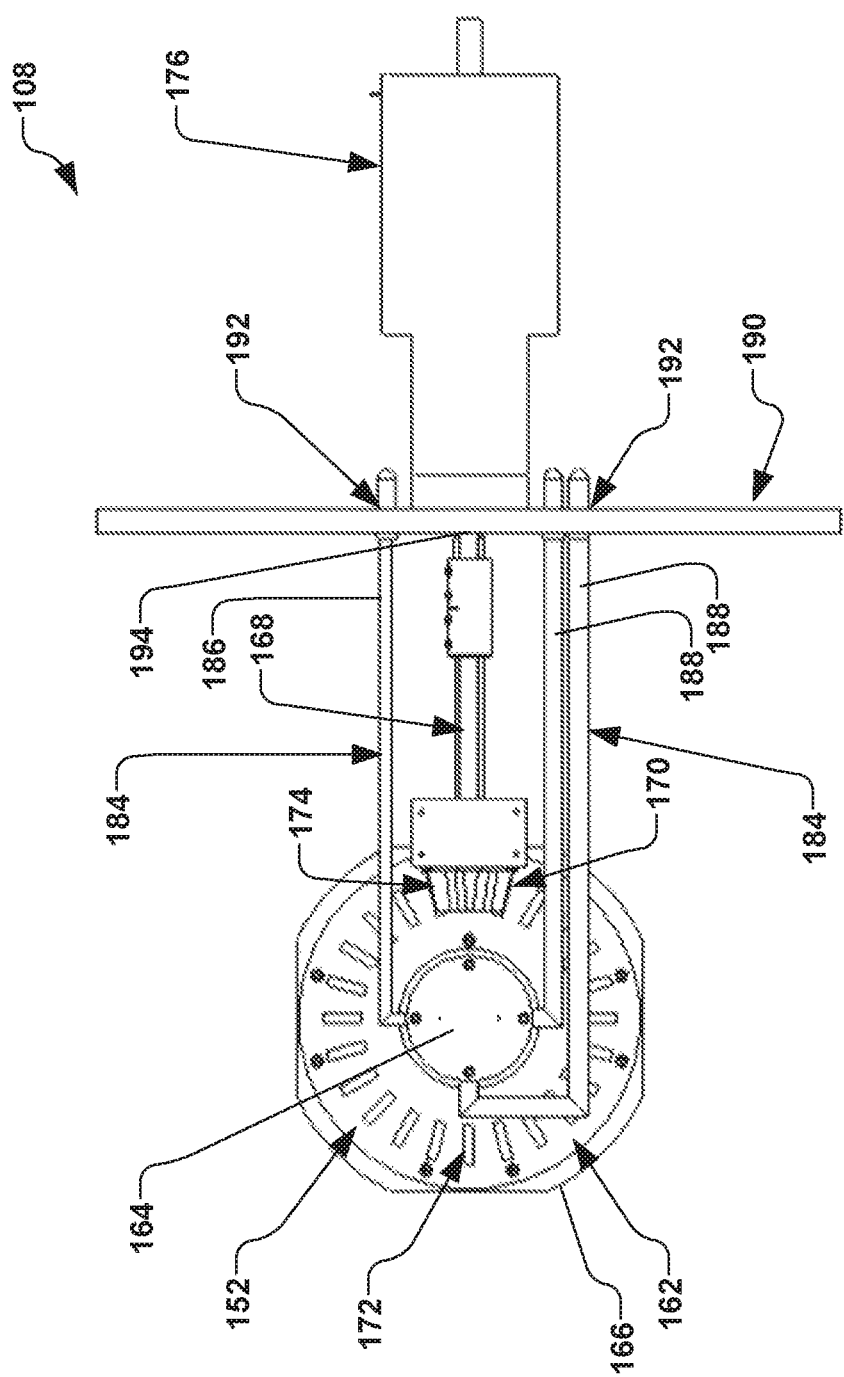
FIG. 4 is a plan view of an example ion source having a plurality of arc chambers according to various examples of the present disclosure.

In accordance with one example, as illustrated in FIGS. 3-4, the translation apparatus 152 further comprises an input shaft 168 operably coupled to a gear set 170. The gear set 170, in the present example, comprises a first gear 172 operably coupled to the dynamic cylinder 166 and a second gear 174 operably coupled to the input shaft 168. The input shaft 168, for example, is thus configured to rotate the dynamic cylinder 166 via the gear set 170, thereby providing the selective translation of each of the plurality of arc chambers 150 to the extraction position 154. In one example, the gear set 170 can comprise loose-fitting non-standard gears, which provide advantages for tolerances associated with thermal expansion, material deposits, and common restrictions on lubricants permitted for use in ion implantation systems, as opposed to tighter, more traditional gear sets.

The gear set 170, for example, can have low precision due to large teeth spacing. In order to align the plurality of arc chambers 150 to the extraction position, one or more detents 175, such as spring detents, may be associated with one or more of the dynamic cylinder 166 and the static cylinder 164. The one or more detents 175, for example, thus selectively lock the rotational position of the dynamic cylinder 166 with respect to the static cylinder 164 upon the selective alignment of each of the plurality of arc chambers 150 with the extraction position 154. The one or more detents 175, in one example, can comprise one or more spring plungers (not shown) coupled to the static cylinder 164, wherein the plungers extend into one or more indents or slots (not shown) on dynamic cylinder 166 in order to guide precision rotation of the carrousel 162. The one or more detents 175, for example, can comprise springs comprised of Inconel material due to high temperature environment experienced.

In another example, the translation apparatus 152, in the present example, further comprises a motor 176 (e.g., a stepper motor or servomotor) operably coupled to the input shaft 168, wherein the motor is configured to selectively rotate the shaft, thus selectively rotating or translating the plurality of arc chambers 150. The motor 176, for example, can be controlled by the controller 136 of FIG. 1.

A gas connection element 178, for example, is further associated with each of the plurality of arc chambers 150, respectively, as illustrated in FIG. 2, for inflow of gas into the arc chamber (160A, as shown in FIG. 2) that is in the extraction position 154. Each gas connection element 178, for example, is configured to selectively interface with a fixed gas conduit 180 associated with the static cylinder 164 based on the rotational position of the dynamic cylinder 166. Each gas connection element 178, for example, is configured to align with the fixed gas conduit 180 upon the selective alignment of each of the plurality of arc chambers 150 with the extraction position 154. In one example, the gas connection element 178 and fixed gas conduit 180 are separated by a gap of approximately 0.025 mm in order to minimize gas from escaping through the connection.

According to another example, one or more electrical connection elements 182 are associated with each of the plurality of arc chambers 150, respectively. Each of the one or more electrical connection elements 182, for example, are configured to selectively interface with one or more fixed electrical elements 184 associated with the static cylinder 164 based on the rotational position of the dynamic cylinder. The one or more fixed electrical elements 184 illustrated in FIG. 4, for example, are associated with each of the plurality of arc chambers 150, for example, and comprise a respective cathode electrical connection 186 associated with a cathode (not shown) of the respective arc chamber and filament electrical connections 188 associated with a filament (not shown) the respective each of the plurality of arc chambers.

For example, said connections can be made from static cylinder 164 to through-slots in dynamic cylinder 166. While not shown, straps of conductive material, for example, can be provided for flex and to accommodate movement, and springs can be implemented to push and retract conductors as the dynamic cylinder 166 rotates with respect to the static cylinder, in order to provide adequate electrical contact.

Figure 5:
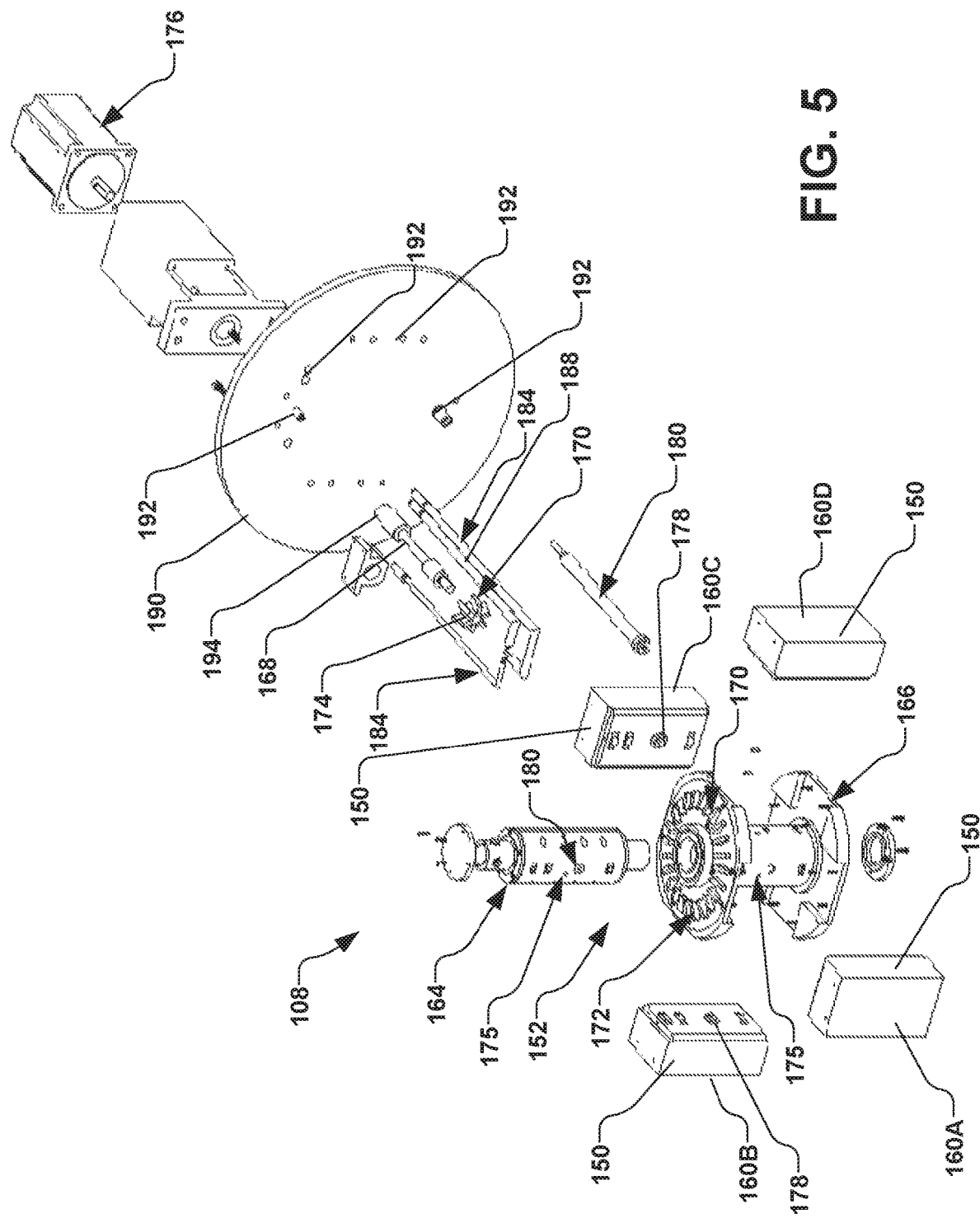
FIG. 5 is an exploded perspective view of an example ion source having a plurality of arc chambers according to various examples of the present disclosure.

It is noted that the ion source 108 of FIG. 1 maintains isolation of the vacuum environment 126 from the external environment 134 by a vacuum flange 190 illustrated in FIGS. 3-5, whereby passages 192 are provided through the vacuum flange for the input shaft 168, one or more fixed electrical elements 184, etc. A ferrofluidic seal 194, for example, is further provided to isolate the input shaft 168.

In accordance with another embodiment, the plurality of arc chambers 150 of FIG. 2, for example, can be provided as being generally identical. For example, each of the plurality of arc chambers 150 are configured to implant a particular species (e.g., Boron). As such, if one of the plurality of arc chambers 150 (e.g., arc chamber 160A) that is currently in service at the extraction position 154 suffers a failure or reaches a predetermined lifetime, another one of the plurality of arc chambers (e.g., arc chamber 160B, 160C, or 160D) can be translated to the implant position with a minimal of downtime, and without substantially altering the vacuum environment 126. Thus, downtime associated with the maintenance of the ion implantation system 100 is decreased. For example, the present example contemplates approximately quadrupling the uptime of the ion implantation system due to the four arc chambers 160A-160D being coupled to the carrousel 162. It is again noted that, while four arc chambers 160A-160D are described in the present example, any number of arc chambers are contemplated.

In another example embodiment, the plurality of arc chambers 150 (e.g., four arc chambers 160A-160D) are each provided in the carrousel 162 as having a unique configuration with respect to the other, whereby each of the unique arc chamber, for example, is configured for a specific dopant species (e.g., boron, carbon, arsenic, etc.), or a predetermined set of implantation characteristics (e.g., a predetermined current, power, beam type, etc.). For example, a respective configuration of each of the plurality of arc chambers 150 is provided for a plurality of different species, for enhancing the performance of the ion implantation system 100 when implanting selected one or more species, and/or for preventing a failure mode unique to a particular species. For example, arc chamber 160A can be configured to produce boron ions, arc chamber 160B can be configured to produce carbon ions, and so on.

Alternatively, the plurality of arc chambers 150 can comprise a combination of unique and identical arc chambers 160A-160D. For example, arc chambers 160A and 160B can be provided as being generally identical to one another, while arc chambers 160C and 160D can provided as being generally identical to one another, while also being collectively unique to arc chambers 160A and 160B. As such, any combination of unique and identical arc chambers 160A-160D, as well as the quantity of the plurality of arc chambers 150 is contemplated as falling within the scope of the present disclosure.

It is noted that the configuration of the carrousel 162 shown in the Figures is not to be considered as limiting, as any mechanism for selectively positioning one of the plurality of arc chambers 150 at the extraction position 154 is contemplated, including, but not limited to, rotational, linear, and oscillatory mechanisms.

Thus, the present disclosure provides a design for a system and apparatus for placing each of the plurality of arc chambers 150 at the extraction position 154 of an ion implantation system without substantially disturbing the vacuum environment 126 associated therewith. The design, for example, may include a motion of the plurality of arc chambers by a dynamic cylinder and gears, alignment-assisting plungers, directional gas connections between cylinders, and spring-loaded electrical contacts. Additional supports for electrical connections in a static cylinder are contemplated, along with providing spring plungers as being easily replaceable components, and o-rings for gas input to the static cylinder.

Beyond the presently disclosed concept of switching out the arc chamber 150, the present disclosure further provides selective coupling (e.g., make and/or break connections) of various electrical and gas connections to enable a single set of power supplies and gas systems to feed the plurality of chambers, thus further minimizing costs associated with the system. The present disclosure further provides for the location of features to generally ensure that arc chamber exit apertures are correctly oriented with respect to the remainder of the beamline.

It shall be further appreciated that the present disclosure is not to be limited to specific translation apparatuses shown in the Figures. For example, various other translation apparatuses are contemplated, such as those driven by belts, pulleys, levers, direct drive, indirect drive, or manual translation. Further, while rotation is one embodiment of translating the plurality of arc chambers 150, various other translations are considered, such as a linear row of arc chambers that are linearly translated, arc chambers set on a uniform or non-uniform track or various other translation systems.

Figure 6:
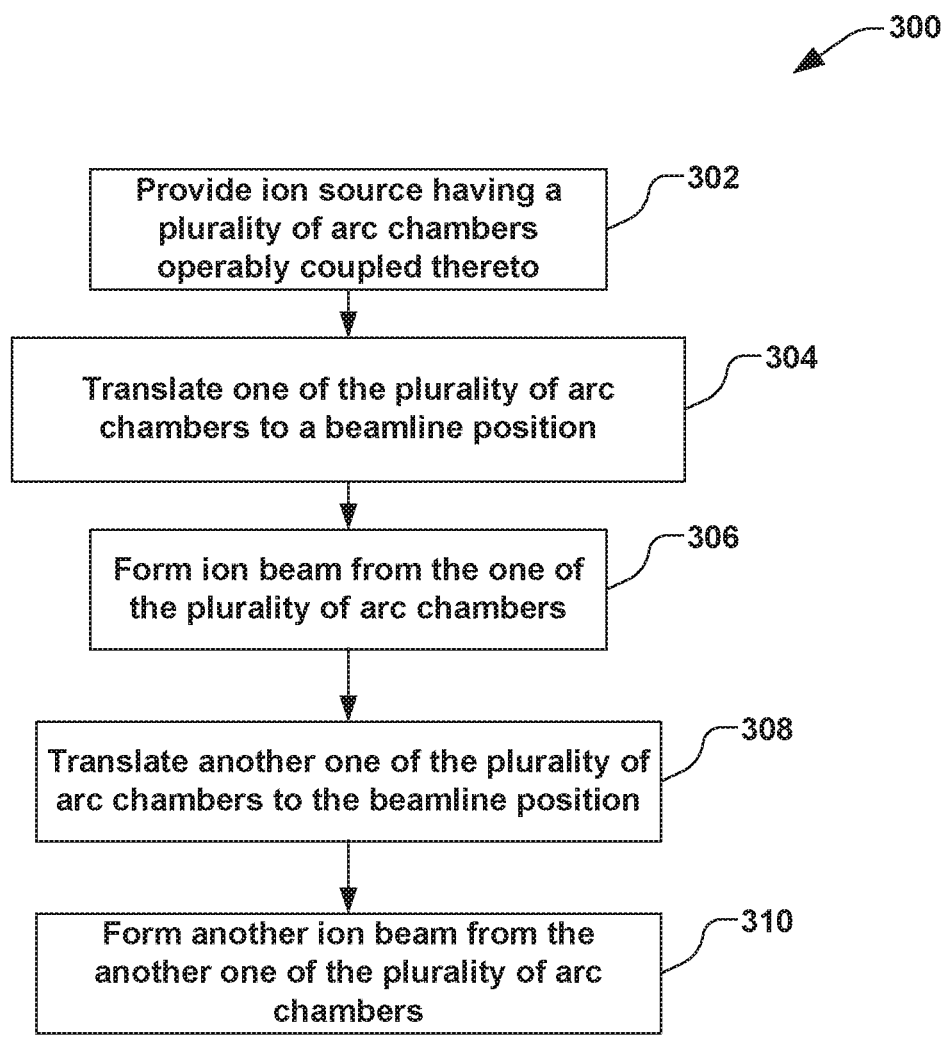
FIG. 6 is a flowchart illustrating a method for ion implantation utilizing multiple arc chambers according to another example.

In another aspect of the disclosure, FIG. 6 illustrates a method 300 for forming an ion beam. It should be noted that while exemplified methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 shown in FIG. 2, for example starts with act 302 by providing an ion source having a plurality of arc chambers operably coupled thereto. In act 304, one of the plurality of arc chambers is translated (e.g., rotated via the carrousel discussed above) to a beamline position. A selection of the one of the plurality of arc chambers for use in act 304 may be performed prior to the performance of act 304, wherein the selection may be based on a desired characteristic of implant (e.g., species, temperature, power, contamination level, etc.).

In act 306, an ion beam is formed utilizing the one of the plurality of arc chambers. In act 308, another one of the plurality of arc chambers is translated to the beamline position. A selection of the another one of the plurality of arc chambers for use in act 308, for example, may be performed prior to the performance of act 308, wherein the selection may be based on another desired characteristic of implant (e.g., species, temperature, power, contamination level, etc.). In act 310, another ion beam is formed utilizing the another one of the plurality of arc chambers.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplified embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. An ion source for forming an ion beam, the ion source comprising:
    an extraction position generally defining a terminus of the ion beam;
    a plurality of arc chambers; and
    a translation apparatus configured to selectively translate each of the plurality of arc chambers to the extraction position, wherein the translation apparatus comprises a carrousel, wherein the carrousel comprises:
        a static cylinder that is rotationally fixed with respect to the extraction position;
        a dynamic cylinder rotatably coupled to the static cylinder, wherein the plurality of arc chambers are operably coupled to the dynamic cylinder and circumferentially spaced thereabout, and wherein a rotational position of the dynamic cylinder with respect to the static cylinder selectively aligns each of the plurality of arc chambers with the extraction position; and a gas connection element associated with each of the plurality of arc chambers, respectively, wherein each gas connection element is configured to selectively interface with a fixed gas conduit associated with the static cylinder based on the rotational position of the dynamic cylinder, and wherein each gas connection element is configured to align with the fixed gas conduit upon the selective alignment of each of the plurality of arc chambers with the extraction position, whereby the gas connection element and fixed gas conduit are separated by a gap.

2. The ion source of claim 1, wherein the translation apparatus further comprises an input shaft and a gear set, wherein the gear set comprises a first gear operably coupled to the dynamic cylinder and a second gear operably coupled to the input shaft, wherein the input shaft is configured to rotate the dynamic cylinder via the gear set, thereby providing the selective translation of each of the plurality of arc chambers to the extraction position.

3. The ion source of claim 2, wherein the translation apparatus further comprises a motor operably coupled to the input shaft, wherein the motor is configured to selectively rotate the input shaft.

4. The ion source of claim 1, wherein the translation apparatus further comprises one or more detents associated with one or more of the dynamic cylinder and the static cylinder, wherein the one or more detents selectively lock the rotational position of the dynamic cylinder with respect to the static cylinder upon the selective alignment of each of the plurality of arc chambers with the extraction position.

5. The ion source of claim 1, further comprising:
one or more electrical connection elements associated with each of the plurality of arc chambers, respectively, wherein each of the one or more electrical connection elements are configured to selectively interface with one or more fixed electrical elements associated with the static cylinder based on the rotational position of the dynamic cylinder.

6. The ion source of claim 1, wherein the gap is approximately 0.025 mm.

7. The ion source of claim 5, wherein the one or more electrical connection elements associated with each of the plurality of arc chambers comprise respective electrical connections to a cathode and a filament associated with the respective each of the plurality of arc chambers.

8. The ion source of claim 1, wherein two or more of the plurality of arc chambers are identical to one another.

9. The ion source of claim 1, wherein at least one of the plurality of arc chambers has at least one unique feature with respect to a remainder of the plurality of arc chambers.

10. The ion source of claim 1, wherein at least one of the plurality of arc chambers is configured to form a plasma from a first source species, and at least another one of the plurality of arc chambers is configured to form a plasma from a second source species, wherein the first source species differs from the second source species.

11. The ion source of claim 10, wherein the first source species comprises carbon and the second source species comprises boron.

12. An ion implantation system, the ion implantation system comprising:
an ion source configured to form an ion beam along a beamline, wherein the ion source comprises a plurality of arc chambers, wherein each of the plurality of arc chambers is selectively positionable along the beamline to respectively form the ion beam, wherein the ion beam has characteristics associated with the respective each of the plurality of arc chambers that is selectively positioned along the beamline, wherein the plurality of arc chambers are operably coupled to a carrousel, wherein the carrousel comprises:
a static cylinder that is rotationally fixed with respect to the beamline;
a dynamic cylinder rotatably coupled to the static cylinder, wherein the plurality of arc chambers are operably coupled to the dynamic cylinder and circumferentially spaced thereabout, and wherein a rotational position of the dynamic cylinder with respect to the static cylinder selectively aligns each of the plurality of arc chambers with the beamline; and
a gas connection element associated with each of the plurality of arc chambers, respectively, wherein each gas connection element is configured to selectively interface with a fixed gas conduit associated with the static cylinder based on the rotational position of the dynamic cylinder, and wherein each gas connection element is configured to align with the fixed gas conduit upon the selective alignment of each of the plurality of arc chambers with the beamline, whereby the gas connection element and fixed gas conduit are separated by a gap.

13. The ion implantation system of claim 12, wherein the ion source is configured to selectively position each of the plurality of arc chambers along the beamline based on one or more implant conditions.

14. The ion implantation system of claim 13, wherein the one or more implant conditions comprise one or more of a desired species of an implant, a desired function of the implant, a predetermined length of time of operation of the ion source, a fault condition associated with the ion source, and a particle contamination condition.

15. The ion implantation system of claim 12, further comprising an input shaft and a gear set, wherein the gear set comprises a first gear operably coupled to the dynamic cylinder and a second gear operably coupled to the input shaft, wherein the input shaft is configured to rotate the dynamic cylinder via the gear set, thereby selectively positioning of each of the plurality of arc chambers along the beamline.

16. The ion implantation system of claim 15, further comprising a motor operably coupled to the input shaft, wherein the motor is configured to selectively rotate the input shaft.

17. The ion implantation system of claim 12, wherein two or more of the plurality of arc chambers are identical to one another.

18. The ion implantation system of claim 12, wherein the plurality of arc chambers comprises four arc chambers in the form of a cross.

19. The ion implantation system of claim 12, wherein the gap is approximately 0.025 mm.

* * * * *